(12) United States Patent
Furuuchi et al.

(10) Patent No.: US 6,462,318 B2
(45) Date of Patent: Oct. 8, 2002

(54) PROTECTIVE ELEMENT

(75) Inventors: Yuji Furuuchi, Kanuma (JP); Masami Kawazu, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/851,998

(22) Filed: May 10, 2001

(65) Prior Publication Data

US 2001/0044168 A1 Nov. 22, 2001

(30) Foreign Application Priority Data

May 17, 2000 (JP) ........................................ 2000-145691

(51) Int. Cl.$^7$ ................................................. H05B 1/02
(52) U.S. Cl. ...................... 219/517; 219/511; 219/494; 219/553; 361/125
(58) Field of Search ................................ 219/517, 505, 219/483, 486, 501, 511, 497, 553, 494; 338/22 R; 361/124, 119, 117, 125

(56) References Cited

U.S. PATENT DOCUMENTS

| | | | | |
|---|---|---|---|---|
| 3,975,667 A | * | 8/1976 | Bory et al. | 318/39 |
| 4,034,207 A | * | 7/1977 | Tamada et al. | 219/517 |
| 4,168,515 A | * | 9/1979 | Baumbach | 361/124 |
| 4,501,956 A | * | 2/1985 | Bergersen et al. | 219/553 |
| 5,148,005 A | * | 9/1992 | Fang et al. | 219/505 |

FOREIGN PATENT DOCUMENTS

| | | |
|---|---|---|
| JP | A 8-161990 | 6/1996 |
| JP | A 10-116549 | 5/1998 |
| JP | A 10-116550 | 5/1998 |
| JP | B2 27-90433 | 6/1998 |
| JP | A 2000-285778 | 10/2000 |
| JP | A 2000-306477 | 11/2000 |

\* cited by examiner

*Primary Examiner*—Mark Paschall
(74) *Attorney, Agent, or Firm*—Oliff & Berridge, PLC

(57) ABSTRACT

A protective element contains a heat-generating member and a low melting metal member on a substrate. The low melting metal member is caused to blow out by the heat generated by the heat-generating member. The number of locations on the low melting metal member which are able to blow out is larger than the number of locations which are supposed to blow out so that the protective element is endowed with a "fail-safe" function.

6 Claims, 5 Drawing Sheets

1A (x−x Sectional View)

(y−y Sectional View)

(x−x Sectional View)

(y−y Sectional View)

1B

1C

1D (x—x Sectional View)

(x—x Sectional View)

PROTECTIVE ELEMENT

BACKGROUND OF THE INVENTION

1. Field of the Invention

The present invention relates to a protective element wherein a heat-generating member generates heat under abnormal circumstances, which causes a low melting metal member to blow out.

2. Description of the Related Art

Protective elements comprising heat-generating members and low melting metal members layered on a substrate are known to be able to prevent overvoltages as well as overcurrents (e.g. Japanese Patent No. 2790433 and Japanese Patent Application Laid-open No. H8-161990). Such protective elements contain heat-generating members through which electricity is passed in abnormal circumstances, and the heat generated by these members melts the low melting metal. The surface of the electrode on which the low melting metal member is disposed is thereby wetted, which causes the low melting metal member to blow out.

FIG. 7 is a circuit diagram showing an example of an overvoltage-preventing device which utilises such a protective element 1p. FIGS. 8A and 8B show respectively a plane view and a sectional view of the protective element 1p.

The protective element 1p has a structure comprising heat-generating members 3, on which a resist paste has been applied, an insulating layer 4, and a low melting metal member 5 comprising a fuse material, all of which are layered on a substrate 2. In the drawings, 6a and 6b are electrodes for the heat-generating members; the electrode 6b is connected to an electrode in the central portion of the low melting metal member 5 (intermediate electrode 7c), with the connection site being situated between two sites 5a and 5b into which the low melting metal member 5 has been divided. 7a, 7b and 7c are electrodes for the low melting metal member. 8 is a internal sealing component made from solid flux, with which the low melting metal member 5 is sealed to prevent its surface from oxidising, and 9 is an external sealing component comprising a material which has higher melting and softening points than the low melting metal member 5 and which prevents the molten low melting metal member 5 from flowing out of the protective element once it has blown out.

In the overvoltage preventing device shown in FIG. 7, which uses the protective element 1p, terminals A1 and A2 are connected to electrode terminals on the device to be protected; e.g. a lithium-ion battery, while terminals B1 and B2 are connected to electrode terminals of devices such as a charging device connected to the device to be protected. According to the overvoltage preventing device, when an overvoltage that is larger than the breakdown voltage is applied to a zener diode D once the charging of the lithium-ion battery has been started, an abrupt base current $i_b$ will flow and cause a large collector current $i_c$ to flow through the heat-generating members 3 and thereby cause the heat-generating members 3 to heat up. This heat is transmitted to the low melting metal member 5 on the heat-generating members 3, causing the two sites 5a and 5b of the low melting metal member 5 to blow out. This prevents any overvoltage from being applied to the terminals A1 and A2 and simultaneously interrupts the current flowing to the heat-generating members 3.

In order to stop the generation of heat by interrupting the flow of electricity destined for the heat-generating member at the same time that the low melting metal member blows out, such protective elements are constituted in such a way that an intermediate electrode divides the low melting metal member into two sites, both of which will blow out. An example of an embodiment of the connection between the low melting metal member and heat-generating members is taught in Japanese Patent Application Laid-open No. H10-116549 and Japanese Patent Application Laid-open No. H10-116550, wherein the low melting metal member and heat-generating members are both disposed planarly on a substrate, instead of having the low melting metal member being layered on top of the heat-generating members. However, the embodiment is otherwise the same insofar as the low melting metal member blows out in two locations, so as to interrupt the flow of electricity destined for the heat-generating members at the same time that the low melting metal member blows out.

Similarly to the protective element 1p shown in FIGS. 8A and 8B, FIGS. 9A and 9B depict respectively a plane view and a sectional view of a protective element 1q, in which the heat generated from a flow of electricity passing through a heat-generating member 3 causes a low melting metal member 5 to blow out and the flow of electricity destined for the heat-generating member 3 to be simultaneously interrupted (Japanese Patent Application No. H10-110163). Low melting metal member electrodes 7a, 7b and 7c are furnished on a substrate 2 in this protective element 1q, and a low melting metal member 5 (5a, 5b) is disposed so as to bridge these electrodes 7a, 7b and 7c. A heat-generating member 3 is furthermore furnished on the underside of the low melting metal member electrode (intermediate electrode) 7c, with an insulating layer 4 interposed therebetween. The heat-generating member 3 is heated by the flow of electricity passed between the heat-generating member electrode 6b and the leads 6x and 6y coming from the heat-generating member electrode 6a. The heat-generating member electrode 6b is connected to the low melting metal member electrode (intermediate electrode) 7c. Accordingly, the heat generated by the heat-generating member 3 causes both the low melting metal member 5a between the electrodes 7a and 7c, and the low melting metal member 5b between the electrodes 7b and 7c to blow out, and thereby interrupt the flow of electricity passed to the device to be protected, while also interrupting the flow of electricity transmitted to the heat-generating member 3.

However, in such conventional protective elements 1p and 1q as described in the foregoing, there are a total of two locations where the low melting metal member 5 are supposed to blow out when heat is generated by the heat-generating member 3: one location in the middle of the low melting metal member 5a which bridges the low melting metal member electrodes 7a and 7c and one location in the middle of the low melting metal member 5b which bridges the low melting metal member electrodes 7b and 7c; there is an equal number of locations which are able to blow out. Therefore, if a location which is supposed to blow out inexplicably becomes unable to blow out, and thus in abnormal circumstances fails to blow out, the device to be protected may be irretrievably damaged.

SUMMARY OF THE INVENTION

In view of the foregoing problem, it is an object of the present invention to ensure that the number of places on the low melting metal member that are able to blow out is greater than the number of places that are supposed to blow out, thereby imparting a so-called "fail-safe" function to the protective element.

The inventors of the present invention discovered that by forming a portion of the low melting metal member on top of a dummy electrode, locations on the low melting metal member which are able to blow out will be formed on either side of the dummy electrode, and thereby the number of locations which are able to blow out will be greater than the number of locations which are supposed to blow out.

In other words, the present invention provides a protective element which comprises a heat-generating member and a low melting metal member on a substrate, the low melting metal member being caused to blow out by the heat generated by the heat-generating member, wherein a portion of the low melting metal member is formed on top of dummy electrodes so that a number of locations which are able to blow out is greater than the number of locations which are supposed to blow out.

DESCRIPTION OF THE PREFERRED EMBODIMENTS

Figure 1A:
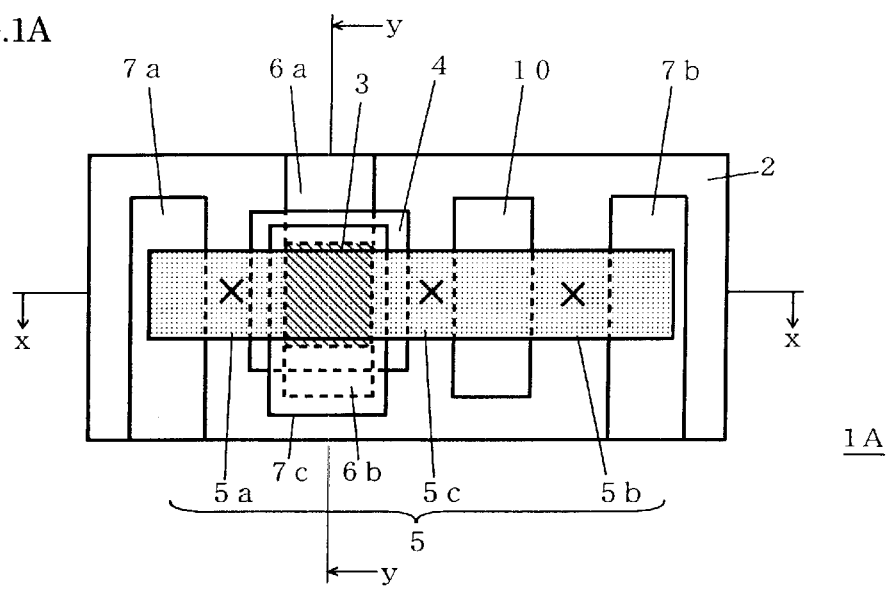
FIGS. 1A, 1B and 1C are respectively a plan view (1A) and sectional views (1B, 1C) of the protective element pertaining to the present invention.

The present invention shall be described in further detail below with reference to the drawings. The designations in the drawings, where identical, refer to the same or similar structural elements.

Figure 1B:
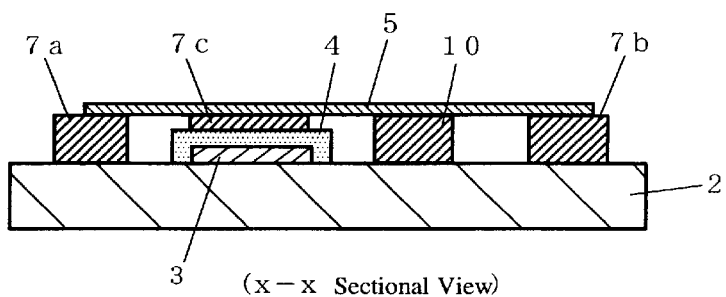
Figure 1C:
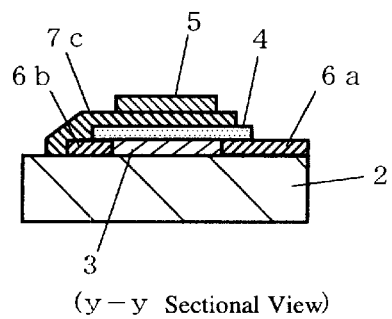
Figure 2:
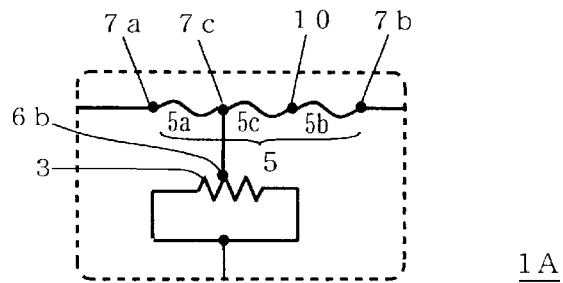
FIG. 2 is a circuit diagram of the protective element pertaining to the present invention.

FIGS. 1A, 1B and 1C show respectively a plane view (1A) and sectional views (1B, 1C) of a protective element 1A pertaining to an embodiment pertaining to the present invention, and FIG. 2 is a circuit diagram of this protective element 1A.

Figure 9A:
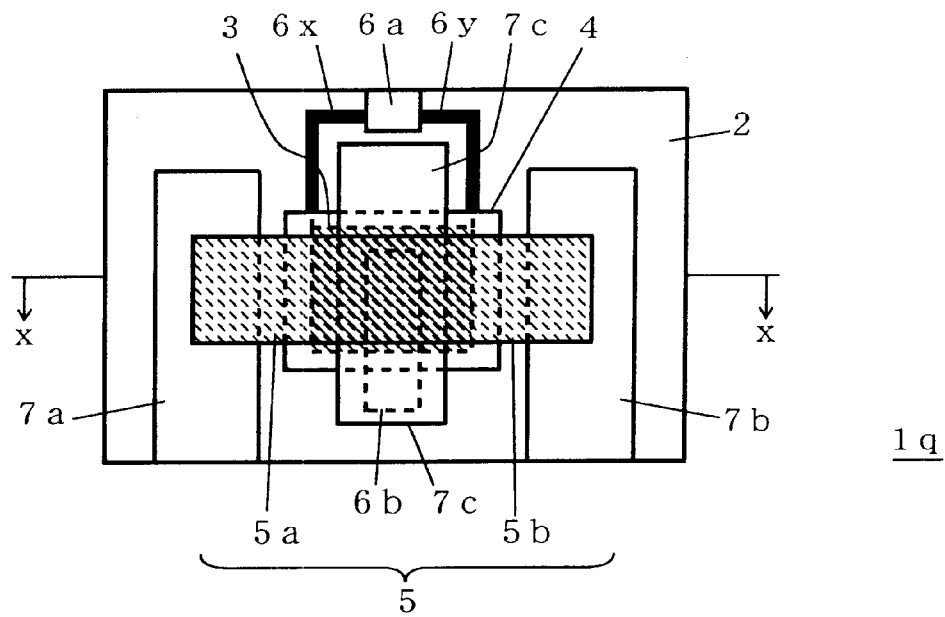
FIGS. 9A and 9B are respectively a plane view and a sectional view of a conventional protective element.
Figure 9B:
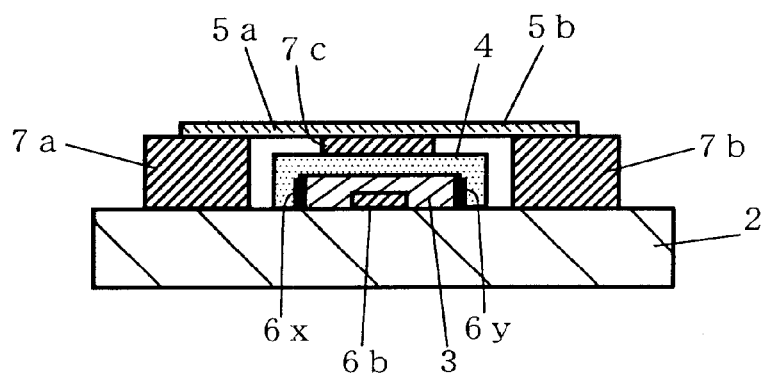

This protective element 1A is the same as the protective element 1$q$ shown in FIGS. 9A and 9B, inasmuch as low melting metal member electrodes 7$a$, 7$b$ and 7$c$ are furnished on a substrate 2; low melting metal member 5 (5$a$, 5$b$ and 5$c$) is furnished so as to bridge these low melting metal member electrodes 7$a$, 7$b$ and 7$c$; a heat-generating member 3 is furnished on the underside of the central low melting metal member electrode 7$c$ with an insulating layer 4 interposed therebetween; a flow of electricity is passed through this heat-generating member 3 via heat-generating member electrodes 6$a$ and 6$b$; and the heat-generating member electrode 6$b$ and the low melting metal member electrode (intermediate electrode) 7$c$ are connected. This protective element 1A, however, is characterised in that a dummy electrode 10 has been furnished between the two low melting metal member electrodes 7$b$ and 7$c$, and a portion of the low melting metal member 5 has been formed on top of the dummy electrode 10.

The dummy electrode 10 does not have any particular role in the circuit shown in FIG. 2, other than having the function of supporting the low melting metal member 5 on the substrate 2 and assuring a wet area when the low melting metal melts. Consequently, the dummy electrode 10 has been formed from a material which has a higher wettability with the molten low melting metal member 5 than with the surface of the substrate 2. This results in that there becomes a total of three locations where the low melting metal member 5 is able to blow out when it melts, as shown by the "X" marks in FIGS. 1A: i.e., one location for each of the three sites 5$a$, 5$b$ and 5$c$ of the low melting metal member which are situated between the electrodes (which includes the low melting metal member electrodes as well as the dummy electrode). However, there are total of two locations where the low melting metal member 5 is supposed to blow out; i.e., one between electrodes 7$a$ and 7$c$ and the other between electrodes 7$c$ and 7$b$. Accordingly, the protective element 1A is possessed of an enhanced fail-safe function due to the number of locations on the low melting metal member 5 which are able to blow out being greater than the number of locations which are supposed to blow out.

As has been described in the foregoing, the dummy electrode 10 has been formed from a material which has a higher wettability with the molten low melting metal member 5 than with the surface of the substrate 2. However, it is preferable for the low melting metal member electrodes 7$a$, 7$b$ and 7$c$ also to have good wettability with the low melting metal member when it has melted so that the heat generated by the heat-generating member 3 will cause the low melting metal member 5 to melt and blow out quickly. Specific examples of materials used to form the low melting metal member electrodes 7$a$, 7$b$ and 7$c$ or the dummy electrode 10 when the surface of the substrate 2 to which the low melting metal member 5 is connected comprises a ceramic, glass epoxy or a polyimide include copper or another single metallic material, with a surface of Ag—Pt, Au, Ag—Pd or the like. From an industrial manufacturing standpoint, in particular, it is preferable for the dummy electrode and the low melting metal member electrodes to be formed from the same electrode material.

Any of various low melting metal members which have conventionally been used as fuses can be used as the material for forming the low melting metal member 5; e.g., an alloy selected from Table 1 in paragraph (0019) in Japanese Patent Application Laid-Open No. H8-161990.

The heat-generating member 3 can be formed by applying a resist paste comprising an inorganic binder such as sodium silicate or an organic binder such as a thermosetting resin to an electrically conductive material such as ruthenium oxide or carbon black. The heat-generating member 3 can also be formed by printing, plating, vapour-depositing or sputtering a thin film comprising ruthenium oxide or carbon black, or gluing or laminating these films.

There is no particular limitation to the substrate 2; plastic films, glass epoxy substrates, ceramic substrates and metal substrates can all suffice. An inorganic substrate is preferable.

The insulating layer 4 is layer which provides insulation between the heat-generating member 3 and the low melting metal member 5 and can comprise e.g. epoxy, acrylic or polyester or any of other various organic resins, or an inorganic material which uses $SiO_2$ as the principal constituent. When the insulating layer 4 is formed from an organic resin, an inorganic powder which has high thermal conductivity can be used, so as to allow the heat generated by the heat-generating member 3 to pass efficiently to the low melting metal member 5.

Figure 3A:
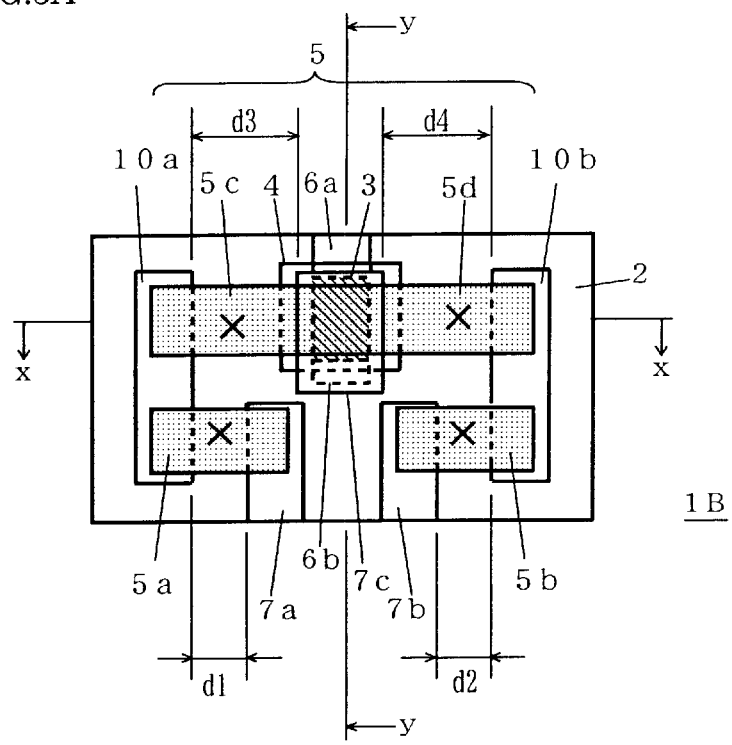
FIGS. 3A, 3B and 3C are respectively a plane view (3A) and sectional views (3B, 3C) of the protective element pertaining to the present invention.
Figure 3B:
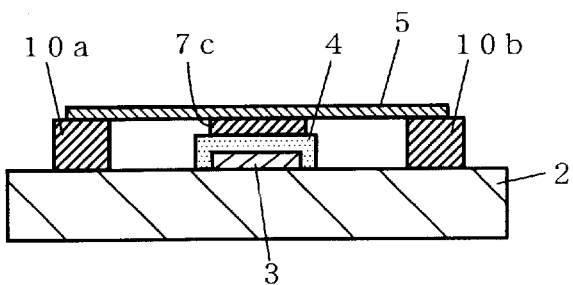
Figure 3C:
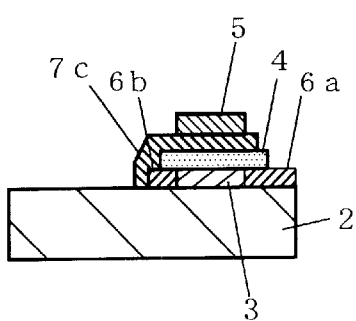
Figure 4:
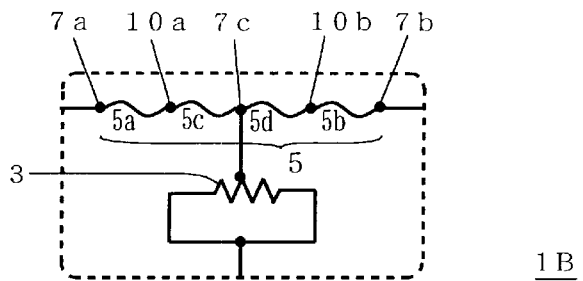
FIG. 4 is a circuit diagram of the protective element pertaining to the present invention.

FIGS. 3A, 3B and 3C are respectively a plane view (3A) and sectional views (3B) and (3C) of a protective element 1B pertaining to a further embodiment of the present invention. FIG. 4 is a circuit diagram of this protective element 1B. This protective element 1B is furnished with dummy electrodes 10a and 10b on either side of a low melting metal member electrode (intermediate electrode) 7c; one of these dummy electrodes 10a bridges a low melting metal member 5a and a low melting metal member 5c, while the other dummy electrode 10b bridges a low melting metal member 5b and a low melting metal member 5d. The protective element 1B, therefore, has four locations which are able to blow out when the low melting metal member 5 melts, as shown by the "X" marks in FIG. 3A. On the other hand, there are a total of two locations where this low melting metal member 5 are supposed to blow out; i.e., one location between a low melting metal member electrode 7a and the low melting metal member electrode (intermediate electrode) 7c, passing over the dummy electrode 10a, and one location between a low melting metal member electrode 7b and the low melting metal member electrode (intermediate electrode) 7c, passing over the dummy electrode 10b. Hence, the number of locations which are able to blow out in the low melting metal member 5 is two greater than the number of locations which should blow out in this protective element 1B, which enables an enhanced "fail-safe" function which is significantly greater than that of the aforedescribed protective element 1A.

It is preferable for the four locations which are able to blow out in the protective element 1B to all blow out at virtually the same time as the low melting metal member 5 melts. The end portions of the low melting metal member electrodes 7a and 7b are thus positioned close to the heat-generating member 3 in the protective element 1B, to allow the heat generated by the heat-generating member 3 to be transmitted to the low melting metal member 5 from these end portions as well.

When patterning or another problem causes any lag in the time that the plurality of locations which can blow out 10 on the low melting metal member 5 require to melt when the heat-generating member 3 generates heat, the location which is able to blow out which is furthest from the heat-generating member 3 and the heat-generating member 3 itself may be brought into thermal contact via a material which possesses good thermal conductivity; alternatively a portion of the substrate 2 and the like may be thermally insulated in order to block the diffusion of unnecessary heat from the heat-generating member 3 and effectively introduce the heat by means of the low melting metal member 5. An example of a thermal insulation method involves opening a gap in the substrate 2 and employing a material with low thermal conductivity into a portion of the substrate 2.

Figure 5:
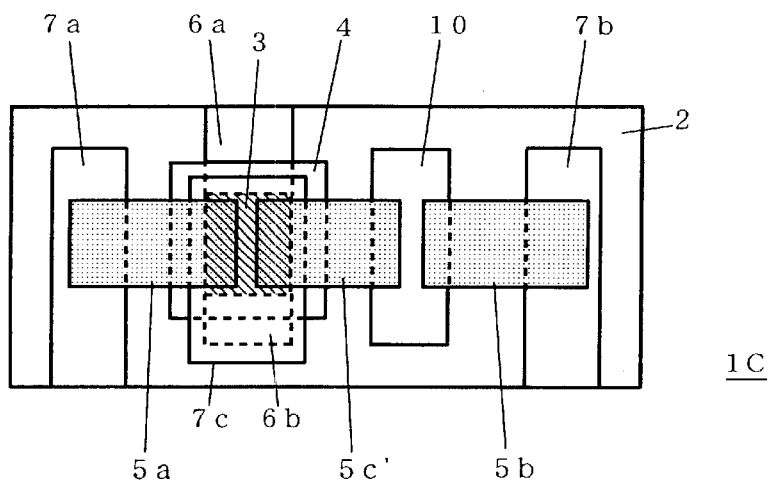
FIG. 5 is a plane view of the protective element pertaining to the present invention.

The protective element 1C shown in FIG. 5, is the protective element 1A shown in FIG. 5, with metal member 5c, which is the middle of the three independent metal members 5a, 5b and 5c which form one of the low melting metal members 5, having been replaced by low melting metal member 5c', which has a higher melting temperature than the low melting metal members 5a and 5b flanking it. According to this protective element 1C, the time required for the low melting metal member 5b to blow out is slower relative to the low melting metal member 5a, and therefore, it is advantageous to create a lag in the times required for the circuit to be interrupted, between the two terminals on the side of the circuit to be protected, which are connected to the low melting metal members 7a and 7b.

Figure 6:
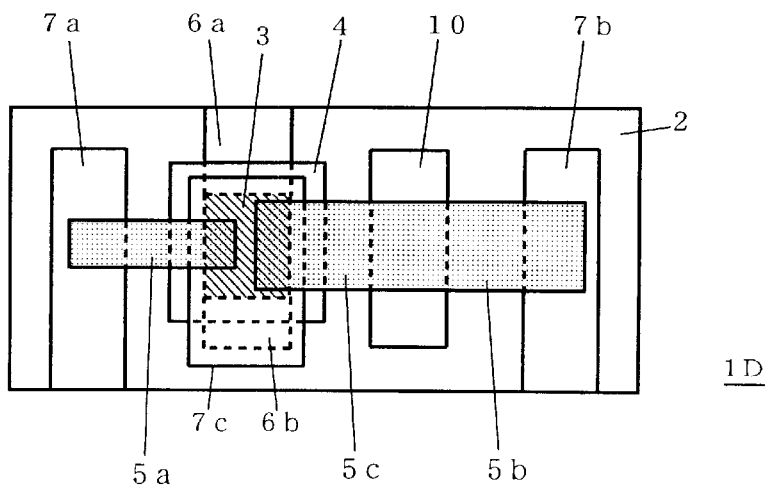
FIG. 6 is a plane view of the protective element pertaining to the present invention.
Figure 7:
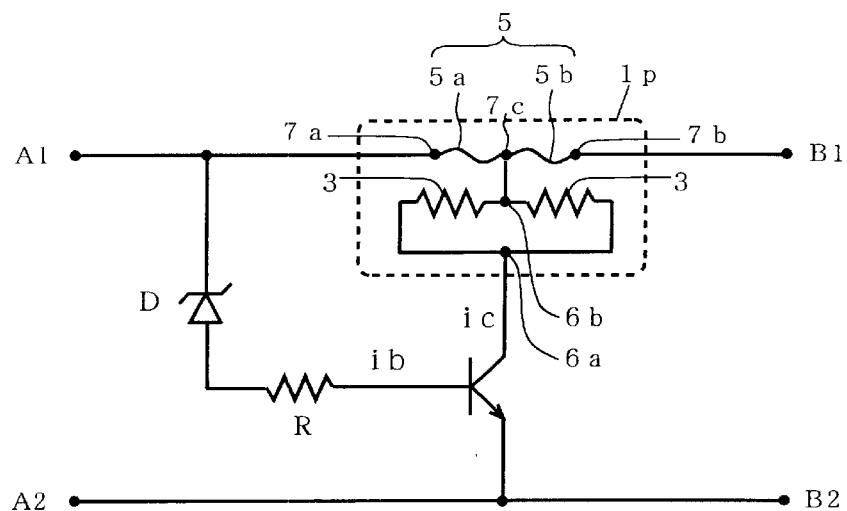
FIG. 7 is a circuit diagram of an overvoltage protection device.
Figure 8A:
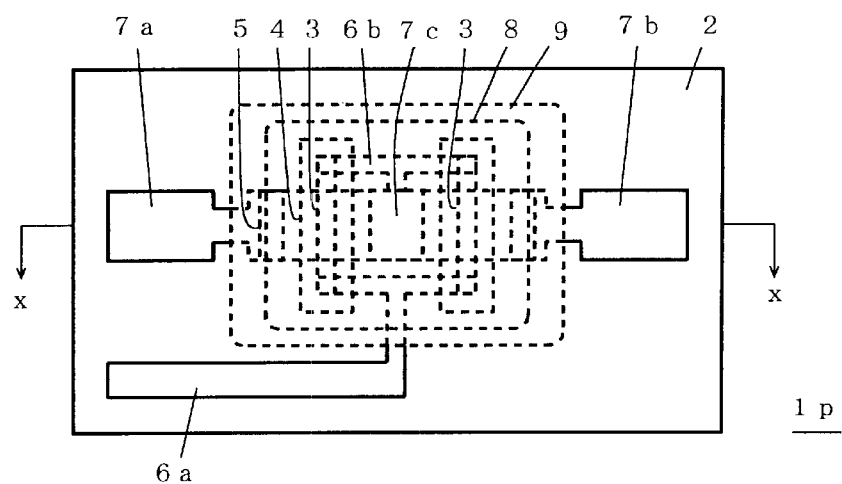
FIGS. 8A and 8B are respectively a plane view and a sectional view of a conventional protective element.
Figure 8B:
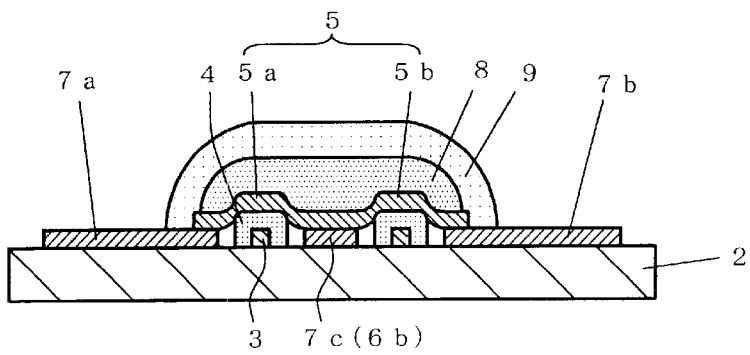

The protective element 1D shown in FIG. 6 employs a low melting metal member 5a for bridging low melting metal member electrodes 7a and 7c that has a different cross-sectional area from that of the low melting metal members 5b and 5c which bridge the low melting metal member electrode 7b, the dummy electrode 10 and the low melting metal member electrode 7c. This enables it to have the same function as the aforedescribed protective element 1C.

The protective element pertaining to the present invention has been described in detail in the foregoing; however, the present invention can assume various other embodiments. For example, as necessity demands, the number of dummy electrodes may be increased, and the number of locations which are able to blow out in the low melting metal member 5 may also be increased. All of the protective elements 1A, 1B, 1C and 1D are furnished with an insulating layer 4 interposed between the heat-generating member 3 and the low melting metal member electrode 7c; however, this insulating layer 4 may be eliminated (Japanese Patent Application No. H11-94385). Furthermore, as taught in Japanese Patent Application Laid-Open No. H10-116549 and Japanese Patent Application Laid-Open No. H10-116550, the heat-generating member 3 and the low melting metal member 5 may be disposed planarly on the substrate 2.

In order to prevent oxidation of the surface of the low melting metal member 5, an internal sealing component comprising solid flux or the like can be furnished thereon, and on its exterior can be furnished an external sealing component or cap for preventing the low melting metal member 5 from melting and flowing out from the protective element, once it has blown out.

EXAMPLES

The present invention shall be described in further detail with the aid of working examples.

Working Example 1

The protective element 1A shown in FIGS. 1A to 1C was prepared as described below.

Low melting metal member electrodes 7a and 7b; dummy electrode 10 and heat-generating member electrodes 6a and 6b were formed on an alumina ceramic substrate (9 mm×3 mm) which had been prepared for use as the substrate 2. A silver paste (Du Pont Company; QS174) was accordingly printed thereon, and baked for 30 minutes at 870° C. A heat-generating member 3 was then formed, and therefore a ruthenium oxide resist paste (Du Pont Company; DP1900) was printed thereon and baked for 30 minutes at 870° C. (thickness: 10 μm; size: 0.1 mm×2.0 mm). A silica insulating paste (Du Pont Company; AP5346) was then printed on the heat-generating member 3 and baked for 30 minutes at 500° C. to form an insulating layer 4. A low melting metal member electrode 7c and the aforedescribed low melting metal member electrodes 7a and 7b were formed on the insulating layer 4 in a similar manner.

A low melting metal foil (Sn : Pb=25:75) (size: 1.0 mm×7.0 mm; thickness: 0.06 mm) was prepared for use as the low melting metal member 5 and thermocompression bonded so as to be able to support the low melting metal ember electrodes 7a, 7b and 7c and the dummy electrode 10.

A resistance of 25 mΩ was measured from the end portion of the low melting metal member 5 on the si de of the low melting metal member electrode 7a to the end portion on the side of the low melting metal member electrode 7b.

Working Example 2

The protective element 1B shown in FIGS. 3A to 3C was prepared as described below. Low melting metal member electrodes 7a and 7b; dummy electrodes 10a and 10b and heat-generating member electrodes 6a and 6b were formed on an alumina ceramic substrate (size: 7 mm×5 mm) which had been prepared for use as the substrate 2. A silver paste (Du Pont Company; QS174) was accordingly printed thereon, and baked for 30 minutes at 870° C. A heat-generating member 3 was then formed, and therefore a ruthenium oxide resist paste (Du Pont Company; DP1900) was printed thereon and baked for 30 minutes at 870° C. (thickness: 10 μm; size: 0.1 mm×2.0 mm). A silica insulating paste (Du Pont Company; AP5346) was then printed on the heat-generating member and baked for 30 minutes at 500° C. to form an insulating layer 4. The low melting metal member electrode 7c and the aforedescribed low melting metal member electrodes 7a and 7b were formed on the insulating layer 4 in a similar manner.

Two low melting metal foils (Sn:Pb=25:75) (size: 1.0 mm×2.5 mm; thickness: 0.06 mm) were prepared for use as the low melting metal members 5a and 5b, and one low melting metal foil (Sn:Pb=25:75) (1.0 mm×6.0 mm in size; 0.06 mm in thickness) was prepared for use as the low melting metal members 5c (5d); these were thermocompression bonded to the low melting metal member electrodes 7a, 7b and 7c. In this case, the distance d1 between the low melting metal member electrode 7a and the dummy electrode 10a, and the distance d2 between the low melting metal member electrode 7b and the dummy electrode 10b, was 1.0 mm, while the distance d3 between the low melting metal member electrode 7c and the dummy electrode 10a and the distance d4 between the low melting metal member electrode 7c and the dummy electrode 10b was 1.5 mm.

A series resistance of 35 mΩ was measured from the end portion of the low melting metal member 5a on the side of the low melting metal member electrode 7a to the end portion on the side of the low melting metal member 7b, via the low melting metal members 5a, 5c (5d), 5b.

Evaluation

In the protective element 1B pertaining to Working Example 2, the site of a low melting metal member 5c located between the dummy electrode 10a and the low melting metal member electrode 7c was hypothetically made completely not to blow out, by applying an epoxy adhesive to the low melting metal member 5c at this site and allowing it to cure (please refer to FIG. 3). Next, a 4 W flow of electricity was fed into the heat-generating member 3 which caused it to generate heat. 30 sec after the electricity was first fed thereinto the aforedescribed low melting metal member site 5c had not blown out; however, low melting metal member 5a, located between the dummy electrode 10a and the low melting metal member electrode 7a, low melting metal member 5d, located between the dummy electrode 10b and the low melting metal member electrode 7c, and low melting metal member 5b, located between the dummy electrode 10b and the low melting metal member electrode 7b had all blown out. This revealed that the flow of electricity fed to the circuit to be protected was interruptible, as was the flow of electricity fed to the heat-generating member 3.

The protective element pertaining to the present invention has a number of locations on the low melting metal member which are able to blow out that is larger than the number of locations which are supposed to blow out, and is therefore possessed of a "fail-safe" function.

The entire disclosure of the specification, claims, drawings and summary of Japanese Patent Application No. 2000-145691 filed on May 17, 2000 is hereby incorporated by reference.

What is claimed is:

1. A protective element, which comprises a heat-generating member and a low melting metal member on a substrate, the low melting metal member is caused to blow out by the heat generated by the heat-generating member, wherein a portion of the low melting metal member is formed on dummy electrodes so that a number of locations in the low melting metal member that are able to blow out is greater than the number of locations that are intended to blow out when heat generated by the heat-generating member causes the low melting metal to melt.

2. The protective element according to claim 1, wherein a plurality of low melting metal members are bridged by dummy electrodes.

3. The protective element according to claim 1, wherein the dummy electrodes are constituted from an electrode material which is identical to the material of the low melting metal member electrode.

4. The protective element according to claim 1, wherein the plurality of locations in the low melting metal member which are able to blow out do so non-simultaneously.

5. The protective element according to claim 2, wherein the plurality of locations in the low melting metal member which are able to blow out do so non-simultaneously.

6. The protective element according to claim 3, wherein the plurality of locations in the low melting metal member which are able to blow out do so non-simultaneously.

* * * * *